(12) United States Patent
Tassart (10) Patent No.: US 9,172,346 B2
(45) Date of Patent: Oct. 27, 2015

(54) NUMERIC AUDIO SIGNAL EQUALIZATION

(71) Applicant: ST-Ericsson SA, Plan-les-Ouates (CH)

(72) Inventor: Stéphan Tassart, Paris (FR)

(73) Assignee: ST-Ericsson SA, Plan-les-Ouates (CH)

( * ) Notice: Subject to any disclaimer, the term of this patent is extended or adjusted under 35 U.S.C. 154(b) by 15 days.

(21) Appl. No.: 14/346,806

(22) PCT Filed: Sep. 24, 2012

(86) PCT No.: PCT/EP2012/068808
§ 371 (c)(1),
(2) Date: Mar. 24, 2014

(87) PCT Pub. No.: WO2013/064311
PCT Pub. Date: May 10, 2013

(65) Prior Publication Data
US 2015/0180436 A1    Jun. 25, 2015

Related U.S. Application Data (60) Provisional application No. 61/561,306, filed on Nov. 18, 2011.

(30) Foreign Application Priority Data

Nov. 3, 2011 (EP) .................................... 11306421

(51) Int. Cl.
*H03G 5/16* (2006.01)
*H03G 5/00* (2006.01)
*H03G 3/20* (2006.01)

(52) U.S. Cl.
CPC ................ *H03G 5/165* (2013.01); *H03G 3/20* (2013.01); *H03G 5/005* (2013.01)

(58) Field of Classification Search
None
See application file for complete search history.

(56) References Cited

U.S. PATENT DOCUMENTS

| | | | |
|---|---|---|---|
| 5,524,022 A | 6/1996 | Kihara et al. | |
| 2007/0195873 A1 | 8/2007 | Azizi | |
| 2009/0086990 A1* | 4/2009 | Christoph | .................. 381/71.12 |

FOREIGN PATENT DOCUMENTS

EP    1087523 A2    3/2001

OTHER PUBLICATIONS

International Search Report, International Application No. PCT/EP2012/068808. Date of mailing: Jan. 3, 2013. European Patent Office, Rijswijk, Netherlands.

*Primary Examiner* — Paul Huber
(74) *Attorney, Agent, or Firm* — Coats & Bennett, PLLC (57) ABSTRACT

A method for configuring an electronic device having an equalizer suited for processing a numeric audio signal according to an objective equalization improves the equalization of the numeric audio signal. The equalizer has a transfer function that implements a set of band-pass filters having a constant band-pass and a configurable weight in the transfer function. The method provides a set of objective gains representing the objective equalization, with each objective gain corresponding to a respective frequency. The method also determines values of the weights of the band-pass filters that minimize an error evaluated by comparing the set of objective gains to the transfer function. The set of band-pass filters includes at least one pair of band-pass filters having a common central frequency and distinct band-passes. The method also sets the weights of the band-pass filters to the determined values.

35 Claims, 5 Drawing Sheets

NUMERIC AUDIO SIGNAL EQUALIZATION

TECHNICAL FIELD

The invention relates to the field of signal processing, and more particularly to a method, a program, a data storage medium and an electronic device for equalizing a numeric audio signal and/or for configuring an equalizer.

BACKGROUND

Digital (i.e. numeric) audio Equalization (also noted EQ or EQUA) is a widely known functionality needed in many audio applications, such as the enhancement of audio rendering in music player configuration or the correction of audio transducers such as loudspeakers or microphones. Among equalization techniques, graphic audio equalization allows the user to modify the audio equalization curve visually and in real-time. A graphic equalizer generally presents a limited amount of spectral bands and the user of the equalizer is free to modify the amplitude, generally in a decibel (dB) scale, in a limited range for each band (e.g. between −12 dB and +12 dB).

Many audio graphic equalization realizations exist. The complexity of realizations usually depends on the relying technology (whether the signal is analog or digital). A vast literature describes many ways of realizing graphic audio equalizers suited for processing a numeric audio signal. Different designs correspond to different needs.

One category of graphic audio equalizers suited for processing a numeric audio signal relies on multi-rate implementations with a polyphase analysis (respectively synthesis) network. These are known as efficient digital implementations for uniform filter bank. With these equalizers, a tree structured filter bank can implement logarithmic scaled bands. Multi-rate solutions are efficient but quite complex to realize. Thus, multi-rate implementations are not appropriate for low-latency applications.

Another category of graphic audio equalizers suited for processing a numeric audio signal relies on a FIR direct-form implementation with an adhoc FIR coefficient optimization procedure, such as the well known least-square procedure. This design method is well suited for linear-phase filter design cases. However, these equalizers also present a high latency. Furthermore, a FIR direct-form implementation requires a large amount of taps (and therefore a significant complexity) in order to cover low-frequency bands.

A last category of graphic audio equalizers suited for processing a numeric audio signal relies on a bank (i.e. a set) of band-pass filters, tuneable in gain. Such equalizers have an improved latency and a simple architecture.

The filters of the bank may be of constant band-pass. The paper entitled "Using Stereo 10-Band Graphic Equalizer using the DSP56001", Motorola, 1988 provides an example of a graphic equalizer belonging to this last category with ten bands implemented as a constant band-pass biquadratic filter. In other words, the band-pass, or the quality factor (Q), is not tuneable. Such equalizers present an issue of spectral ripples, notably when similar gains are given in adjacent bands. The paper entitled "Graphic Equalizer design Using High-Order Recursive Filters", M. Holters, U. Zölzer, Proc of DAFx-06, 2006, and U.S. Pat. No. 5,687,104, discuss ways of limiting such spectral ripples. However, the issue of ripples remains significant.

Other graphic equalizers belonging to this last category, based on variable-Q filters (e.g. band-pass filters with a tuneable, i.e. configurable, band-pass), such as the solution discussed in U.S. Pat. No. 7,266,205 B2 allow a better control of the ripple phenomenon. The implementation of variable-Q filters however presents some issues, notably within the context of fixed-point processors. Variable-Q filters may present ringing audio artefacts when IIR parameters are switched (while the signal is processed). Also, local filter divergence or clipping may occur when IIR parameters are interpolated. Finally, there may be a formation of limit cycles when the system returns to rest. This is notably due to the fact that variable-Q filters have variable parameters that belong to feedback loops.

SUMMARY

The object of the present invention is to alleviate at least partly the above mentioned drawbacks. More particularly, the invention aims at improving the equalization of a numeric audio signal.

This object is achieved with a method for configuring an electronic device comprising an equalizer suited for processing a numeric audio signal according to an objective equalization. The equalizer has a transfer function that implements a set of band-pass filters. Each band-pass filter has a constant band-pass. Each band-pass filter has a weight in the transfer function that is configurable. The method comprises providing a set of objective gains representing the objective equalization. Each objective gain corresponds to a respective frequency. The method also comprises determining values of the weights of the band-pass filters that minimize an error. The error is evaluated by comparing the set of objective gains to the transfer function. The set of band-pass filters comprises at least one pair of band-pass filters having a common central frequency and distinct band-passes. The method further comprises setting the weights of the band-pass filters to the determined values.

This object is also achieved with a computer program comprising instructions for performing the method.

This object is also achieved with a data storage medium having recorded thereon the program.

This object is also achieved with an electronic device. The device comprises an equalizer suited for processing a numeric audio signal according to an objective equalization. The equalizer has a transfer function that is based on a set of band-pass filters. Each band-pass filter has a constant band-pass. Each band-pass filter has a weight in the transfer function that is configurable. The set of band-pass filters comprises at least one pair of band-pass filters having a common central frequency and distinct band-passes. The device also comprises at least one memory having recorded thereon instructions for performing the above method. The device further comprises at least one processor configured for executing the program recorded on the memory.

The memory and/or the processor may be, at least partly, part of (or alternatively totally distinct from) the equalizer. The equalizer may in any case comprise at least one memory (e.g. volatile and/or persistent) and at least one processor for processing a numeric audio signal inputted to the equalizer. In an example, the device is a mobile communication device.

The invention offers many advantages, including the following:
Because the equalizer is suited for processing a numeric audio signal according to an objective equalization, the electronic device may be used for equalization of a numeric audio signal, and may thus improve the quality of a numeric audio signal, and/or adapt it to a user's wishes.

The equalizer has a transfer function that implements a set of band-pass filters. Thus, the equalizer performs equalization with a low complexity and a low latency.

Each band-pass filter has a constant band-pass. Thus, the equalizer does not suffer from the issues inherent to variable band-pass filters, such as ringing audio artefacts, local filter divergence or clipping, and formation of limit cycles. The quality of the equalization is thus improved.

The invention allows providing an objective equalization under the form of a set of objective gains and, accordingly, setting the variable parameters of the transfer function (i.e. the weights of the band-pass filters). The invention is thus well-suited for graphic equalization. The transfer function indeed corresponds to the objective equalization.

The set of band-pass filters comprises at least one pair of band-pass filters having a common central frequency and distinct band-passes. Such pair(s) of filters offers a degree of freedom as to the band-pass when determining values of the weights of the band-pass filters that minimize an error. This degree of freedom allows the simulation of the behaviour of a variable band-pass filter. Indeed, for the common central frequency of a pair, many different band-passes (i.e. different values of bandwidth, or, quality factor) may be simulated by combining the two filters of the pair. This allows the reduction of the spectral ripples phenomenon and thereby improves the quality of the equalization.

Further features and advantages of the invention will appear from the following description of embodiments of the invention, given as non-limiting examples, with reference to the accompanying drawings listed hereunder.

DETAILED DESCRIPTION

The method may be performed based on a computer program comprising instructions for performing the method, e.g. by reading the instructions by a processor. The program may be executable on a programmable device. The application program may be implemented in a high-level procedural or object-oriented programming language, or in assembly or machine language if desired. In any case, the language may be a compiled or interpreted language. The program may be a full installation program, or an update program. In the latter case, the program is an update program that updates a programmable device, previously programmed for performing parts of the method, to a state wherein the device is suitable for performing the whole method.

The program may be recorded on a data storage medium. The data storage medium may be any memory adapted for recording computer instructions. The data storage medium may thus be any form of nonvolatile memory, including by way of example semiconductor memory devices, such as EPROM, EEPROM, and flash memory devices; magnetic disks such as internal hard disks and removable disks; magneto-optical disks; and CD-ROM disks.

A device suitable for performing the method may be an electronic device comprising hardware memory, including volatile and/or non volatile memory, and having recorded thereon the program. The memory may store any other information used by the method. For example, the memory may store information such as the values of the weights of the band-pass filters. Also, the memory may store objective gains that are provided. Also, the memory may store a numeric audio signal. The memory is accessible by at least one processor, e.g. a Central Processing Unit (CPU) of the device. The processor may execute the program and may thereby perform the method, without further programming of the device.

The device comprises an equalizer suited for processing a numeric audio signal according to an objective equalization. The equalizer comprises at least one processor and has a transfer function. The transfer function is a relationship between frequencies and gains that may be applied to an input numeric audio signal. In the case of the invention, the transfer function has variable parameters so as to approach the objective equalization.

In an example, the device may further comprise audio convertors and transducers, such as digital to analog convertor (DAC) and a loudspeaker. In such a case, the device may play the numeric audio signal. The device may further comprise a user graphical interface, such as a sensitive screen or a screen and keyboard, for example for performing graphic equalization.

The device may be a communication device. The device may thus comprise a signal emitter and a signal receiver. For example, the device may be a telephone. The device may be a wireless communication device. The device may be mobile (i.e. transportable). The device may for example be a mobile phone (e.g. a cell phone).

Figure 1:
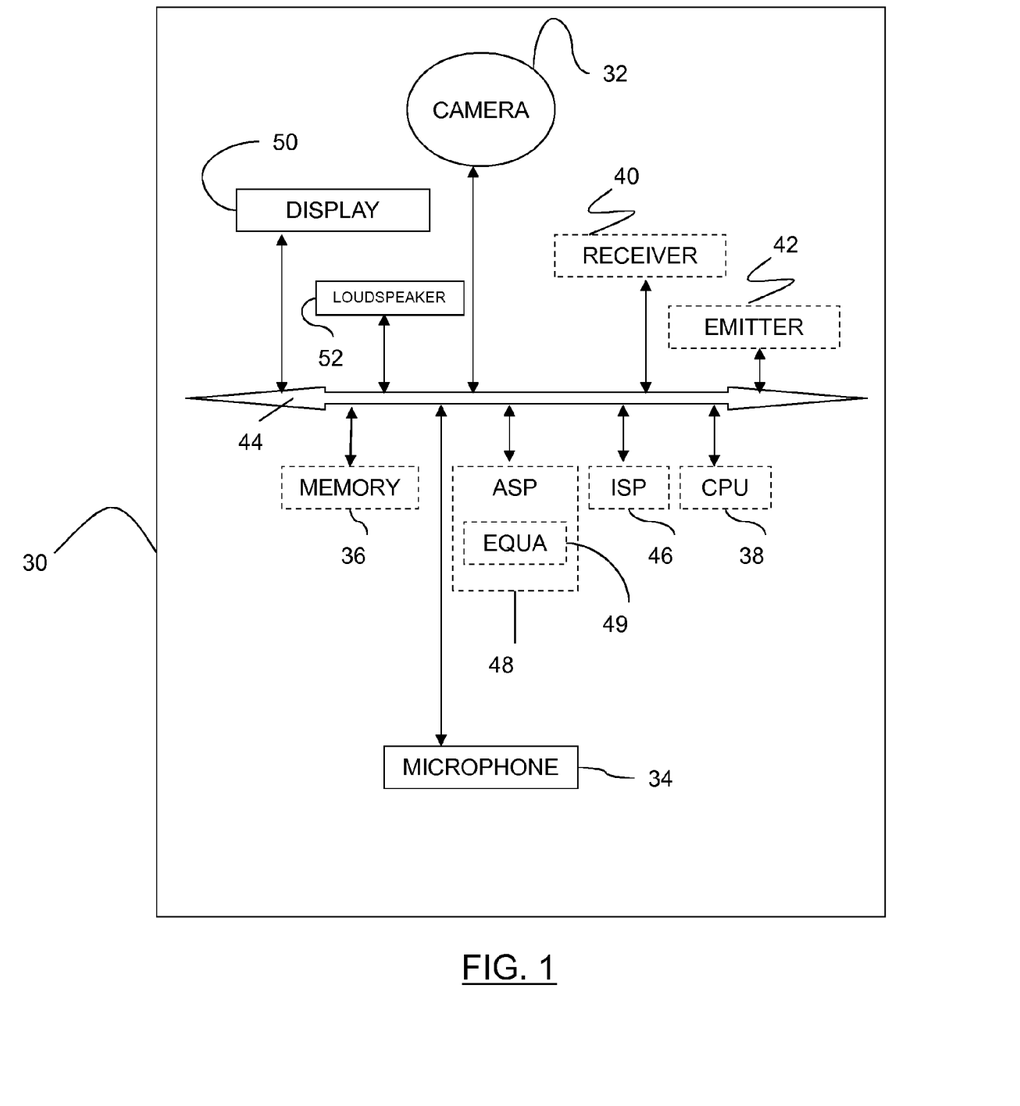
FIG. 1 shows a schematic representation of an example of the electronic device.

It is referred to FIG. 1 which shows a block diagram representing an example of a mobile electronic device 30, which may be a mobile phone, suitable for implementing the method.

In the example, device 30 may be used for capturing audio and image data. For this, device 30 comprises camera 32 and microphone 34 for respectively capturing image and audio data. Device 30 also comprises memory 36 which may comprise volatile and non-volatile memory (not distinguished on the figure). Memory 36 may be divided in several compartments, possibly physically apart in device 30. Memory 36 stores, recorded thereon, instructions for performing the method, possibly already compiled or pre-compiled. Memory 36 also stores, in a volatile or non-volatile way, any captured image and audio data, and any other information used when using device 30 e.g. for performing the method. Device 30 also comprises processors including CPU 38, Image Signal Processor 46 (ISP) and Audio Signal Processor 48 (ASP). These processors access data through bus 44, process the data and circulate the data through the bus 44. Of course, fewer than three processors may physically be embodied, e.g. if one processor accomplishes all computations. On the other hand, more than three processors may physically be embodied, e.g. in the case of parallel processing. Device 30 also comprises display 50 and loudspeaker 52 for outputting data, i.e. for respectively displaying image data and playing audio data. Device 30 also comprises receiver 40 and emitter 42, which are for communicating with the exterior e.g. with other devices, e.g. if device 30 is a cellular phone.

Device 30 also comprises equalizer 49, which is coupled with Audio Signal Processor 48 in the example. The functions performed by the equalizer for the equalization of an audio signal may be performed by ASP 48. For example, device 30 may be used for playing (or rendering) a numeric audio signal stored in memory 36. A user may require equalization through a graphical user interface which may be for example display 50, which may be a sensitive screen. This launches configuration of equalizer 49, driven by a processor such as ASP 48 and/or CPU 38. After that or meanwhile, the numeric audio signal, for example a musical signal, may be accessed by equalizer 49 which applies the transfer function to it and the transformed signal may be played with loudspeaker 52.

Figure 2:
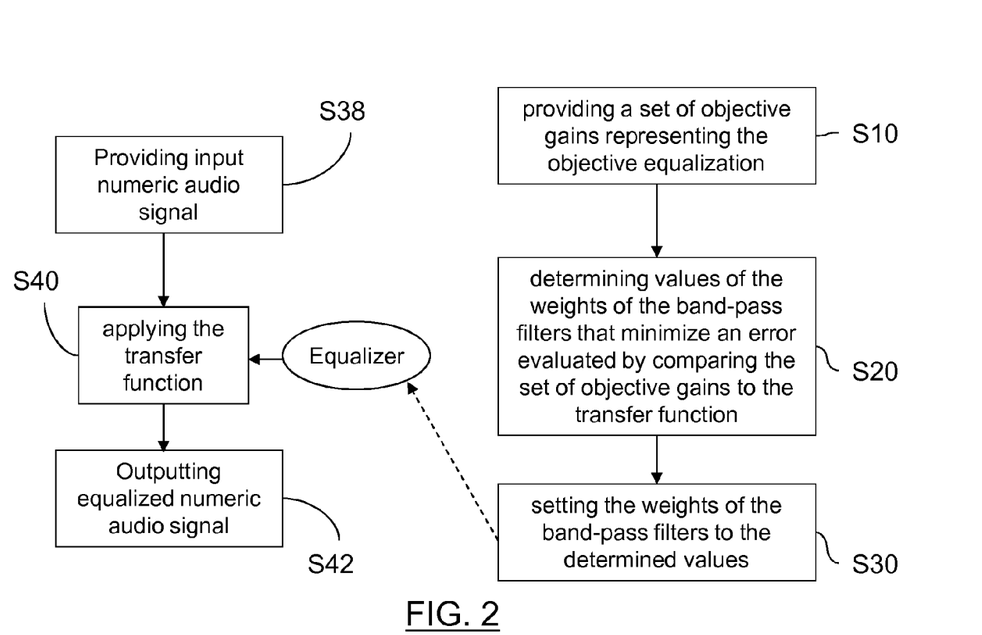
FIG. 2 shows a flowchart of an example of the method.

It is now referred to FIG. 2 which shows a flowchart of an example of the method for configuring any electronic device comprising an equalizer suited for processing a numeric audio signal according to an objective equalization.

The equalizer is suited for processing a numeric audio signal according to an objective equalization. In other words, the equalizer is adapted to modify (i.e. equalize) a numeric audio signal according to a gain/frequency relationship (called the objective equalization, or equalization curve). The equalizer applies a transfer function to the numeric audio signal taken as input and outputs an equalized numeric audio signal. Now, the transfer function of the equalizer of the method implements a set of band-pass filters. This means that the equalizer processes an inputted numeric audio signal via an architecture comprising band-pass filters. (In other words, the equalizer is implemented by a set of band-pass filters.) A filter is a processing module that performs computations on an input numeric signal. A band-pass filter amplifies the signal for frequencies inside a band-pass (i.e. an interval of frequencies, i.e. values inside a band of frequencies). Each band-pass filter has a weight in the transfer function that is configurable (i.e. tuneable, modifiable, settable). In other words, in the equalizer implementation, a configurable weight is applied (or given) to each of the band-pass filters. The weight of a given filter is a scalar factor, or coefficient, that modulates the response of the filter when the transfer function is applied to an input signal. This offers a degree of freedom for each filter and allows the configuration of the equalizer, in other words the modification of the transfer function, e.g. to make it close to the objective equalization.

The method of the example comprises providing (S10) a set of objective gains representing the objective equalization. Each objective gain corresponds (i.e. is associated) to a respective frequency. In other words, the method comprises providing a set of points in the gain/frequency domain. The method then comprises determining (S20) values of the weights of the band-pass filters according to the set of objective gains (possibly via the values of variable parameters of which the weights are functions). The variable parameters of the equalizer (e.g. the weights of the filters) are thus modified to comply with the objective equalization. This is done by determining the values that minimize an error. This may be done by actually solving such a minimum problem, or by any procedure leading to the same result. The error is evaluated by comparing the set of objective gains to the transfer function. In other words, for a given set of values of the weights of the band-pass filters, the error is a measure of difference, or distance, between the objective equalization (represented by the set of objective gains) and the transfer function (which is evaluated with the given set of values used for the weights of the filters in the transfer function). For example, the error is evaluated by comparing the magnitude from the realized transfer function to the idealized transfer function of the objective equalization. The method may thus comprise performing such evaluation or retrieving such evaluation, and modifying the weights until the error is minimized. The method then comprises setting (S30) the weights of the band-pass filters (in the equalizer, as represented by dotted arrow from the box (S30) to the equalizer on FIG. 2) to the determined values (i.e. the values that are determined at (S20)). Thus, when equalizing an audio signal, a transfer function closer to the objective equalization is used.

The band-pass filters have a constant band-pass. The term "band-pass" refers to any band-related characteristic of a band-pass filter. Notably, the term "band-pass" may refer to the Q-factor, or the bandwidth. In other words, the band-pass filters may have a constant Q-factor, or a constant bandwidth (i.e. the term "band-pass" may thus be replaced by "bandwidth" or "Q-factor" in the following). This implies that the retroacting loops of the band-pass filters, as the band-pass filter may have such, only involve constant parameters (i.e. they do not involve any variable parameter). The equalizer thus presents a higher quality of the output signal compared to prior art equalizer that implement variable band-pass filters, notably at transition time when the objective equalization is modified.

This is particularly advantageous in the case of the example, as in the method of FIG. 2, the equalizer continuously applies (S40) the transfer function to a numeric audio signal which is provided (S38) in order to output (S42) an equalized numeric audio signal, the steps (S38), (S40) and (S42) being performed simultaneously while performing the providing (S10), the determining (S20) and the setting (S30). In other words, while the equalizer is equalizing an input numeric audio signal, the configuration of the equalizer may simultaneously occur via (S10)-(S30). The method of the example is thus both for configuring an electronic device comprising an equalizer suited for processing a numeric audio signal according to an objective equalization and for simultaneously processing a numeric audio signal according to the objective equalization (i.e. both for configuring the equalizer and for simultaneously equalizing a numeric audio signal). Indeed, the applying (S40) is always performed by the equalizer as it is configured at the time of the applying (S40). In such a situation, variable band-pass or parameters would generally present risks of ringing artefacts that impact the numeric signal and reduce the quality of the equalized signal at transitions when requiring a new objective equalization. On the contrary, in the case of the method of FIG. 2, the band-pass, and so the parameters, of the filters are constant (i.e. fixed), which allows to avoid the issue. However, the set of band-pass filters comprises at least one pair of band-pass filters having a common central frequency and distinct band-passes. This allows the simulation of a variable band-pass filter and thus the reduction of spectral ripples, which achieves a high quality of equalization.

The equalizer may perform fixed-point implementation, e.g. for performing an equalization of an audio signal. In other words, the processor(s) involved in computations that are performed by the equalizer at least partly implement fixed-point computations. This keeps the equalizer simple and efficient. The band-pass filters may for example be constant-Q biquadratic IIR (Infinite Impulse Response) filters, which are widely known and efficient. The configuration of the equalizer according to the method may however be performed with floating-point implementation.

The determining (S20) of the values of the weights of the band-pass filters that minimize the error may be performed under the constraint of interpolating linearly the band-pass filters for each pair of band-pass filters having a common central frequency and distinct band-passes. In other words, for each central frequency for which there is a pair of band-pass filters having a distinct band-pass, the solution (i.e. the optimal weights, in other words, the weights that minimize the error) may be searched among all interpolations of the two filters of the pair (instead of all linear combinations of the two filters of the pair). This allows a good result in a faster way, as the optimization is performed faster (e.g. local minima are efficiently avoided).

An example of the method for configuring any electronic device comprising an equalizer suited for processing a numeric audio signal according to an objective equalization is now presented with reference to FIGS. 3-10 which illustrate the transfer function and the architecture of the equalizer.

The method of the example relies on an architecture of the equalizer that leads to a transfer function similar to the simple solution presented in the paper entitled "Using Stereo 10-Band Graphic Equalizer using the DSP56001", Motorola, 1988. Therefore, the method of the example relies on an equalizer that uses a bank of constant-Q biquadratic IIR filters. However, in order to simulate a variable-Q configuration, according to the method, one pair of constant-Q filters is associated for each band (instead of one single constant-Q filter). Furthermore, each filter in one pair is configured as a band-pass biquadratic filter with the same central frequency (common central frequency) as the other filter of the pair but with a different bandwidth. A linear interpolation between the two filters of the pair of filters (as a constraint for performing the minimization of the error) simulates a variable-Q filter.

In must be noted that the linear interpolation between two biquadratic band-pass filters (BPF) with the same central frequency but with different bandwidths is not equivalent to one single biquadratric BPF with a variable bandwidth. However, the approximation is good enough. Indeed, interpolating two constant Q-filters has the same effect as tuning a real variable Q-filter with regard to the optimization procedure. Once the variable-Q filter is implemented as the interpolation of two constant-Q biquadratic filters, the embedding system is modified in such a way that the optimization happens jointly for the gain and the interpolation value instead of the gain and the bandwidth (when a bank of variable-Q filters is used as in prior art), or the gain solely (when a bank of constant-Q filters without pairs is used as in prior art). The variable nature of the bandwidth of the realized filters of the equalizer ensures that the behaviour of the equalizer is similar to those implemented with variable-Q biquadratic filters. The performance of the equalizer implemented is similar to those implemented with true variable-Q biquadratic filters. The variable parameters (i.e. the gains and the interpolation parameters) do not belong to any feedback loop. Therefore, no ringing artefact occurs. For each filter, the weight of the filter is equal to the gain parameter multiplied by the interpolation parameter. The legacy signal processing architecture of the paper entitled "Using Stereo 10-Band Graphic Equalizer using the DSP56001", Motorola, 1988 can thus be used. Such simple architecture facilitates fixed-point implementation.

The equalizer of the example may comprise separate asynchronous functional entities (i.e. different blocks comprising processing capabilities which may perform different functions in an asynchronous manner), including a digital signal processing entity, an objective function entity, and a control entity. The entities perform parts of the method. The functions performed by the entities are now discussed.

The equalizer of the example may comprise a digital signal processing entity.

The digital signal processing entity transforms an input audio sample flow x in an output audio sample flow y at the same sampling rate. In other words, the digital signal processing entity is responsible of applying (S40) the transfer function to an input numeric audio signal x. Any sampling rate may be contemplated.

Figure 6:
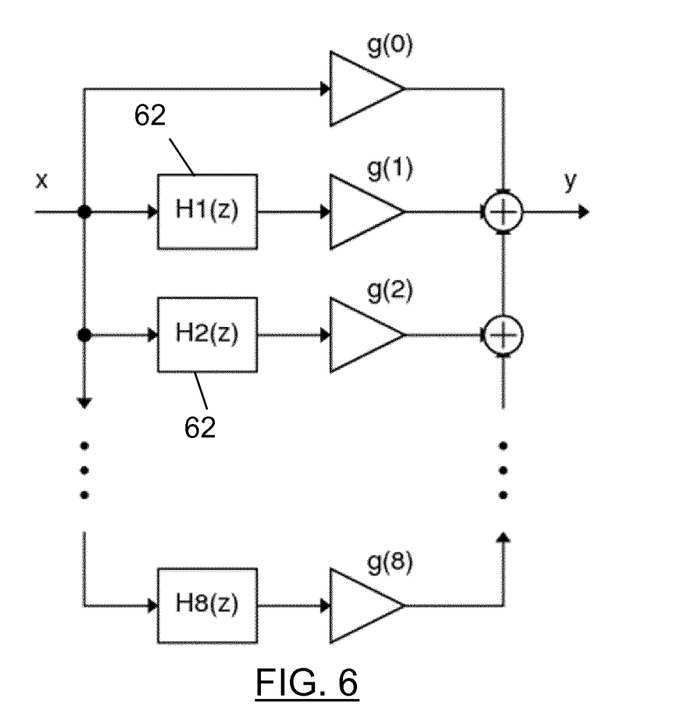
FIGS. 6-10 show examples of the architecture of the equalizer.

FIG. 6 illustrates the architecture of the digital signal processing entity (i.e. the operations performed by the digital signal processing entity) for a parallel 8-band equalizer. In other words, FIG. 6 illustrates the architecture of a transfer function that implements filters for eight central frequencies. The central frequencies correspond to respective transfer blocks 62 on the figure. The equalizer comprises a pair of filters for each of the eight central frequencies which have a different bandwidth. Each block 62 implements an interpolation of two filters having a common central frequency but different bandwidths. However, any number of central frequencies may be contemplated. For the purpose of generality, in the following the amount of available blocks (i.e. the number of central frequencies) is labelled N.

In this example, the input signal x is filtered in parallel by each transfer block 62 which z-transform is given by $H_k(z)$. The output of each block is weighted by a scalar (i.e. gain) $g_k$ and summed to the weighted direct signal so that the transfer function of the complete equalizer is:

$$H(z) = g_0 + \sum_{k=1}^{N-1} g_k H_k(z)$$

The weight $g_0$ of the direct signal may be set to 1 but a variable parameter is alternatively introduced in the example for the sake of generality. The filters of the blocks $H_k(z)$ may be implemented for instance as a serial chain of biquadratic cells, possibly limited to one single cell. The filters of the blocks $H_k(z)$ are constant. In other words, their parameters (e.g. central frequency, bandwidth) is decided during the equalizer design/configuration and do not vary at run time (during equalization).

Figure 3:
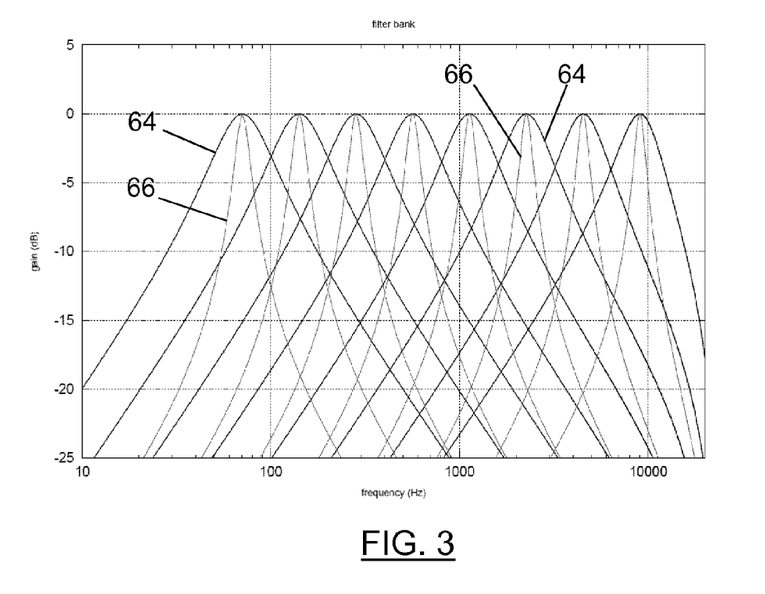
FIGS. 3-5 show examples of the responses of transfer functions.

FIG. 3 shows an example of the response of the transfer functions for every filter of the equalizer of FIG. 6. As can be seen on the figure, the responses form curves with a boss which are typical of biquadratic band-pass filters. The responses are organized in pairs (64, 66) with a common central frequency (the peak of the boss of the response of the transfer function occur for the same frequency for each pair, i.e. the central frequency of the pair) and a different bandwidth (e.g. the width of the boss is wider for a curve 64 than for its corresponding pair curve 66). The pairs separate a specific spectral band organized in an octave scale, which is to say that the central frequency of any pair doubles the central frequency of its adjacent left neighbour.

Figure 4:
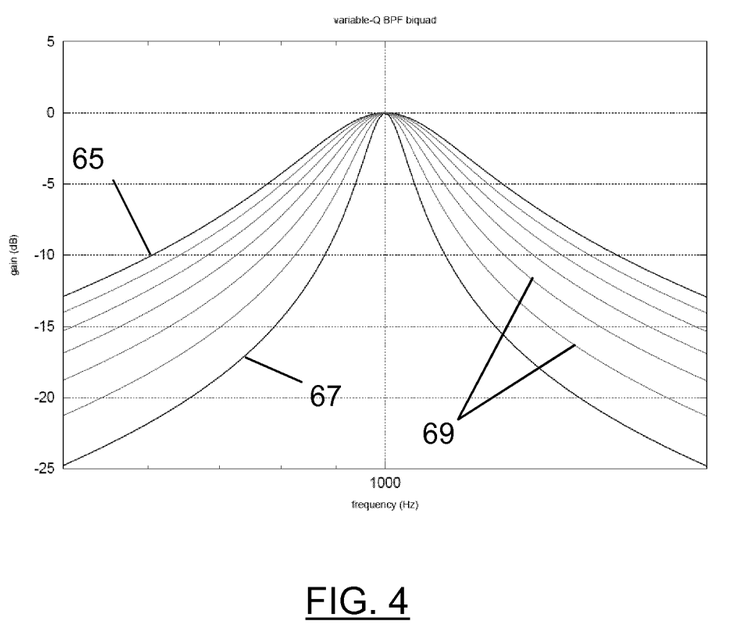

FIG. 4 shows an example of the response of the transfer functions of a variable-Q biquadratic filter which has a 1000 Hz central frequency. As can be seen on FIG. 4, such a filter may implement a transfer function which has for response one of the extreme responses 65 or 67 or any intermediate response 69.

Figure 5:
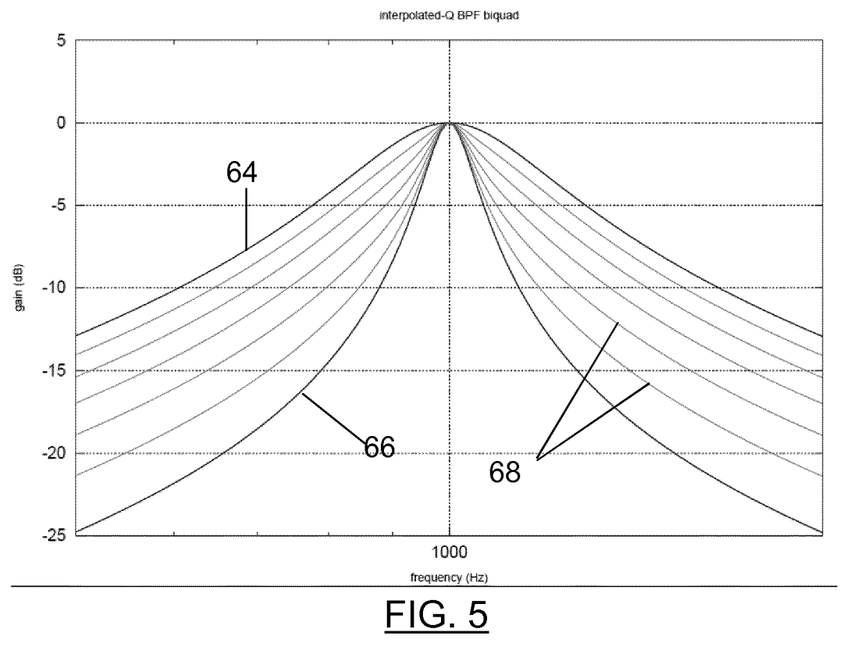

FIG. 5 shows an example of the responses 64 and 66 of the transfer function of the pair of constant band-pass biquadratic filters having a common central frequency equal to 1000 Hz and distinct band-passes, as well as interpolations 68 thereof. The pair of filters of FIG. 5 may be one of the pairs of filters of FIG. 3. In other words, FIG. 5 shows the response of the transfer function of a block 62 of FIG. 3 having a central frequency of 1000 Hz. It must be noted that, although similar, the response curves 64, 66 and 68 of FIG. 5 are not exactly the same as the response curves 65, 67 and 69 of FIG. 4. However, the similarity between them shows that the interpolation of two constant band-pass filters with the same central frequency but different band-passes (such interpolation being achieved by blocks 62 of FIG. 6) simulates the behaviour of one variable band-pass filter with said central frequency.

Figure 7:
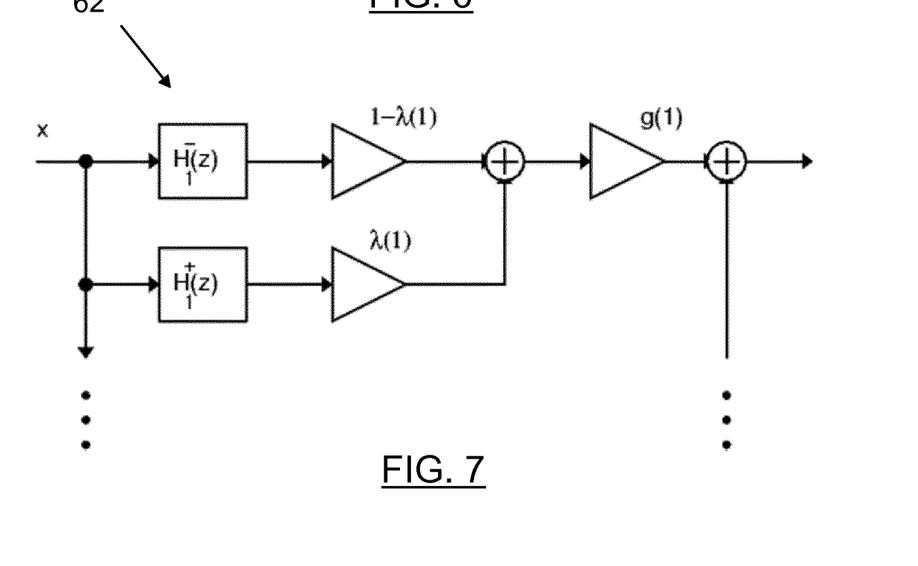
Figure 8:
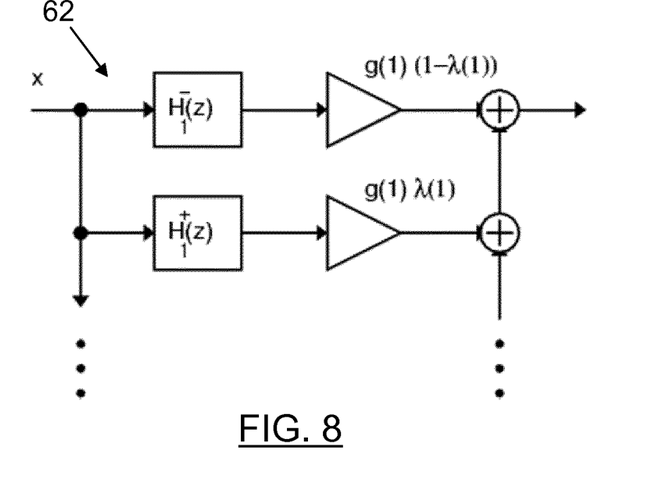

Now, different configurations of the blocks 62 of FIG. 6 may implement the contemplated interpolation of two constant band-pass filters with the same central frequency but distinct band-passes. FIG. 7 shows an example of an architecture of a block 62 of FIG. 6 that implements such interpolation. The block 62 of FIG. 7 is the one having transfer function $H_1(z)$. The input signal x goes through two constant biquadratic IIR band-pass filters with the same central frequency and distinct band-passes that transform the signal with transfer functions respectively noted as $H_1^+(z)$ and $H_1^-(z)$. Thus, with such an architecture, this part of the architecture of the equalizer performs the transfer function $H_1(z)=\lambda(1) \times H_1^+(z) + (1-\lambda(1)) \times H_1^-(z)$. The weights of filters $H_1^+(z)$ and $H_1^-(z)$ in the final transfer function $H_1(z)$ are thus respectively $\lambda(1) \times g(1)$ and $(1-\lambda(1)) \times g(1)$. Alternatively, the band-pass filters may (all) be parallel, as shown on FIG. 8. In other words, the band-pass filters all process the input signal in parallel, are applied a coefficient which is already their final weight in the transfer function and are finally summed. FIG. 8 indeed shows an example of the same block 62 of FIG. 6 that is shown in FIG. 7, which implements the same interpolation with a different architecture. This allows a faster adaptation of existing digital signal processing entities which are based on such a parallel architecture.

Figure 9:
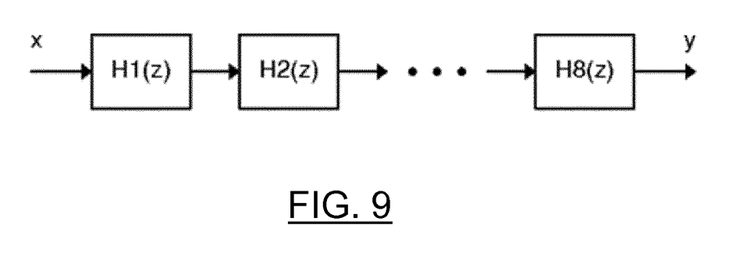
Figure 10:
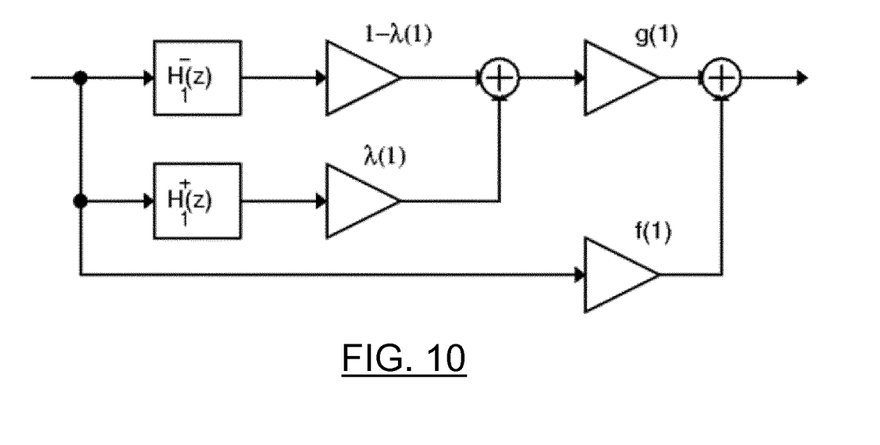

The equalizer is not limited to the architecture of FIG. 6. As an alternate example, the diagrams of FIGS. 9 and 10 describe the digital signal processing operations for a serial 8-band equalizer with different architectures. In FIG. 9, filters $H_k(z)$ commonly implement peaking biquadratic filters. The bandwidth control can be obtained with two interpolated constant-Q filter as shown on FIG. 10.

The transfer function may further implement at least one shelving filter. Indeed, all results of the example are based on a transfer function only implementing band-pass filters but similar results apply for shelving (high-shelving and low-shelving) filters that may be used on the extreme bands. For example, a high-shelving filter may be implemented for the large frequency end and/or a low-shelving filter may be implemented for the low frequency end (the term "end" designates an extremity of the total frequency spectrum covered by the band-pass filters). This offers new possibilities to better approach the objective equalization for large frequencies and/or low frequencies.

The equalizer of the example may comprise an objective function entity.

The equalizer may be a graphic equalizer, thereby allowing the method to comprise the provision, e.g. by a user, of a set of gains (i.e. a set of gains that are to be applied for different bands, or frequencies). The set of objective gains may be derived from such a set of provided gains (as will be explained later) and represents the objective equalization.

The method may then comprise defining an objective function on the frequency domain, constrained by the set of objective gains. The objective function may be a function that best approaches the set of objective gains, with any distance measure. Once defined, the objective function represents the objective equalization. The minimization of the error may then be performed by computing a value representative of the difference between the objective function and the transfer function and minimizing such value. Indeed, the method may comprise requesting a new equalizer configuration, noted $h_p$ by the user. As soon as the user requests a new equalizer configuration, a new objective function, in the spectral (frequency) domain, may be computed. The usage of the objective function is explained later.

The equalizer configuration $h_p$ corresponds to an objective gain set by the user for the bands p, where p is any band identifier from 1 to P. Each band p is characterized by its central frequency $\omega_p$. The method may also define $\omega_0=0$ and $\omega_{P+1}=\pi$. The objective function $F(\omega)$ is searched as a piecewise $3^{rd}$ order polynomial expression, defined on each segment $[\omega_p, \omega_{p+1}]$ for $p \in [0, P]$ with the equality constraints:

$F(\omega)$ and its derivative $F'(\omega)$ are continuous on $[0,\pi]$;

$\forall p \in [1,P], F(\omega_p)=h_p$;

$\forall p \in [2,P-1], F'(\omega_p)=0$, if $(h_p-h_{p-1})(h_p-h_{p+1}) \geq 0$; and $F'(0)=F'(\pi)=0$.

Those equality constraints define a set of admissible objective functions. The objective function is a piecewise polynomial function that may be further constrained by the set of objective gains and that minimizes a measure of oscillations (i.e. a cost function that is increased as the function oscillates more). The method may indeed choose the objective function that minimizes a cost function taking into account ripples:

$$J(F) = \int_0^\pi |F'(\omega)|^2 \, d\omega$$

The constraints are linear and the cost function is quadratic with regard to the unknown polynomial coefficients. Therefore the objective function $F(\omega)$ is found as the solution of a classic quadratic minimization subject to linear equality constraints. Several domains are possible for the objective function, for instance the linear domain, i.e. $F(\omega)$ and $|H(e^{j\omega})|$ are proportional, or the dB domain, i.e. $F(\omega)$ and $\log(|H(e^{j\omega})|)$ are proportional.

The method may comprise providing a set of final gains (e.g. by a user), each final gain corresponding to a respective frequency. For each final gain corresponding to a respective frequency, the method may comprise determining a list (i.e. an ordered set) of objective gains corresponding to the respective frequency. The objective gains are successive (within a list). They are ordered from a current gain corresponding to the respective frequency, to the final gain. The difference between two successive objective gains may be bounded, e.g. by a predetermined threshold. The method may then comprise iterating the providing (S10), the determining (S20) and the setting (S30) over the successive objective gains. In other words, the method divides the request of the user (corresponding to the final gains) into sub-requests (corresponding to the objective gains) and configures the equalizer step by step for each sub-request. The sub-requests are intermediate states between a current state of the equalizer and a final state requested by the user. This allows a smoother transition of the configuration of the equalizer.

For reasons that will be explained later, it is not advisable to deliver to the next processing entities an objective function which is very different from the objective function evaluated from the previous user request. Therefore, the objective function entity may embed a state that is used in order to slice every user request into many sub-requests ensuring that the step $\Delta h_p$ between each sub-request is bounded in absolute value by $\Delta h_{max}$. Provided that the mapping $h \rightarrow F(\omega)$ is continuous, bounding the input steps is equivalent to bounding the output steps $\Delta F(\omega)$.

The equalizer of the example may comprise a control entity.

The control entity serves new weights for the band-pass filters (via the $\lambda(k)$ and the $g(k)$ parameters) to the Digital Signal Processing entity each time a new objective function $F(\omega)$ is delivered by the objective function entity. The weights are evaluated so that an error $E(F,g)$ between the objective function $F(\omega)$ and the equalizer transfer function $H(e^{j\omega})$ is minimized. The error thereby constitutes value representative of the difference between the objective function and the transfer function.

The error may be a spectral difference between the objective function and the transfer function in the decibel domain. Notably, the error may be evaluated as a weighted spectral error in the dB domain:

$$E(F, g, \lambda) = \int_0^\pi W(\omega)(\log(H(e^{j\omega})) - \log(F(\omega)))^2 \, d\omega$$

wherein g and $\lambda$ designate respectively the vector of the $g(k)$ and the vector of the $\lambda(k)$.

Determining (S20) values of the weights of the band-pass filters may further comprise discretizing the spectral difference. It is indeed well known that the solution of the above problem can be approximated by a discrete problem where the continuous sum is replaced by a sum on a discrete mesh, wherein the expression of the error becomes:

$$E(F, g, \lambda) = \sum_{i=0}^{L} W_i(\log(H(e^{j\omega_i})) - \log(F(\omega_i)))^2$$

It is noted that the spectral weight $W(\omega)$ can be simplified with an appropriate non-uniform sampling of the spectrum.

Given the human auditory model properties, it is preferable to select a mesh that appears regular in the Mel domain.

The weight and interpolated bandwidth for each band may thus minimize a spectral error evaluated for instance in dB, on a Mel scale and with a specific spectral weighting for flat spectral area.

The discrete spectral weight $W_i$ can be chosen as a function of $F(W)$ measuring a spectral transition criterion in order to emphasize flat spectral area.

Determining (S20) values of the weights of the band-pass filters may further comprise applying the Newton-Raphson method (to minimize the discrete error). Usually, there is no closed solution for the minimization of the error. Instead, an iterative procedure such as a steepest descent method or a Newton-Raphson method can be used.

Here follows the application of the Newton-Raphson method:

$$g_{n+1} = g_n + \mu \times dg_n \text{ with } dg_n = -S^{-1}(F, g_n, \lambda_n) \nabla_g E(F, g_n, \lambda_n)$$

$$\lambda_{n+1} = \lambda_n + \mu \times d\lambda_n \text{ with } d\lambda_n = -S^{-1}(F, g_n, \lambda_n) \nabla_\lambda E(F, g_n, \lambda_n)$$

wherein $\nabla_g E(F, g_n, \lambda_n)$ and $\nabla_\lambda E(F, g_n, \lambda_n)$ respectively represent the gradient vector of the scalar error function $E(F, g, \lambda)$ with respect to the parameters g and $\lambda$, evaluated at the current approximation $(g_n, \lambda_n)$;

and wherein $S^{-1}(F, g_n, \lambda_n)$ represents the inverse of the hessian matrix of the scalar error function $E(F, g, \lambda)$ evaluated at the current approximation $(g_n, \lambda_n)$.

The Newton steps $dg_n$ and $d\lambda_n$ are evaluated first. The value of $\mu$ is determined next through a procedure known as a line search which seeks minimum for $E(F, g_n + \mu \times dg_n, \lambda_n + \mu \times d\lambda_n)$, for positive $\mu$. The line search is also an iterative procedure which approximates $E(F, g_n + \mu \times dg_n, \lambda_n + \mu \times d\lambda_n)$ at each step as a second order polynomial in $\mu$.

The method may limit the search to a bounded subregion of every possible parameters in order to prevent signal overflow and clipping in the Digital Signal Processing entity. A set of additional linear constraints can thus be used:

$$g_{min} \leq g_n \leq g_{max}$$

wherein the vector comparison means that the comparison stands, line per line, for every elements of the vectors.

The method may also better take into account the interpolation process, in order to prevent the Control entity to choose a couple that corresponds to a value $\lambda_7$, greater than 1 or lesser than 0. A simple solution consists in introducing the additional constraint: $0 \leq \lambda_n \leq 1$.

Given those constraints, the Newton step obtained must be replaced by the solution of a quadratic programming problem (i.e. quadratic minimization subject to linear inequalities).

The iteration procedure needed for the aforementioned minimization example cannot diverge since, by construction of the algorithm, the optimized parameters are bounded. This bounding box prevents signal overflow and clipping in the Digital Signal Processing entity.

Furthermore, the line search procedure may be slightly modified by constraining $\mu$ to stay in $[0, 1]$. Since the subregion defined by the constraints $g_{min} \leq g_n \leq g_{max}$ and $0 \leq \lambda_n \leq 1$ is convex, this modifications insures that these constraints are still met after the line search procedure has converged.

Other adaptations driven by real-time constraints and discussed below may be implemented. For example, the method may comprise providing a new set of objective gains while applying the Newton-Raphson method and continuing the applying of the Newton-Raphson method on the basis of the new set of objective gains.

It is not necessary to restart the iterative procedure (e.g. steepest descent, Newton-Raphson, etc.) with the default starting values $g_0$ and $\lambda_0$ each time a new objective function $F$ is delivered to the Control entity. Provided that $F$ evolves with small steps, which is insured by the Objective Function entity, the method may continue the iterative procedure instead with the last parameters $g_n$ and $\lambda_n$, presumably corresponding to the weights obtained from a previous evocation of the Control entity with a previous objective function $F_{prev}$.

It is not necessary either to wait for the final convergence of the iterative procedure from the Control entity in order to serve a new weight vector to the Digital Signal Processing entity. Consider instead to serve asynchronously the Digital Signal Processing entity on a regular basis, for instance, every N iterations, or every time the weight parameter step is above a threshold.

The weights of the filters in the transfer function may thus vary in order to answer a new request from the user. In this case, the variations of the weights may be further smoothed, in order to prevent any audible clicks or distortions.

The invention claimed is:

1. A method for configuring an electronic device comprising an equalizer suited for processing a numeric audio signal according to an objective equalization, wherein the equalizer has a transfer function that implements a set of band-pass filters, each band-pass filter has a constant band-pass, and each band-pass filter has a weight in the transfer function that is configurable, the method comprising:

providing a set of objective gains representing the objective equalization, each objective gain corresponding to a respective frequency;

determining values of the weights of the band-pass filters that minimize an error evaluated by comparing the set of objective gains to the transfer function, wherein the set of band-pass filters comprises at least one pair of band-pass filters having a common central frequency and distinct band-passes; and setting the weights of the band-pass filters to the determined values.

2. The method of claim 1 further comprising continuously applying, by the equalizer, the transfer function to an input numeric audio signal while substantially simultaneously providing the set of objective gains representing the objective equalization, determining the values of the weights of the band-pass filters that minimize the error, and setting the weights of the band-pass filters to the determined values.

3. The method of claim 1 further comprising performing, by the equalizer, fixed-point implementation.

4. The method of claim 1 wherein determining the values of the weights of the band-pass filters that minimize the error comprises determining the values of the weights of the band-pass filters that minimize the error under the constraint of interpolating linearly the band-pass filters for each pair of band-pass filters having a common central frequency and distinct band-passes.

5. The method of claim 1 wherein the band-pass filters are parallel.

6. The method of claim 1 further comprising:
providing a set of final gains, each final gain corresponding to a respective frequency;
for each final gain corresponding to a respective frequency, determining a list of objective gains corresponding to the respective frequency, wherein the objective gains are successive, from a current gain corresponding to the respective frequency, to the final gain, wherein the difference between two successive objective gains is bounded; and
iterating providing the set of objective gains representing the objective equalization, determining the values of the weights of the band-pass filters that minimize the error, and setting the weights of the band-pass filters to the determined values over the successive objective gains.

7. The method of claim 1 wherein comparing the set of objective gains to the transfer function comprises defining an objective function on the frequency domain and computing a value representative of the difference between the objective function and the transfer function, wherein the objective function is a piecewise polynomial function that is constrained by the set of objective gains and that minimizes a measure of oscillations.

8. The method of claim 7 wherein the value representative of the difference between the objective function and the transfer function is a spectral difference between the objective function and the transfer function in the decibel domain.

9. The method of claim 8 wherein determining the values of the weights of the band-pass filters comprises discretizing the spectral difference and applying a Newton-Raphson method.

10. The method of claim 9 further comprising providing a new set of objective gains while applying the Newton-Raphson method and continuing to apply the Newton-Raphson method on the basis of the new set of objective gains.

11. The method of claim 1 wherein the transfer function further implements at least one shelving filter.

12. A computer program product comprising a non-transitory computer-readable medium having program instructions stored thereon that, when executed by a processor circuit, configures the processor circuit to configure an electronic device comprising an equalizer suited for processing a numeric audio signal according to an objective equalization, wherein the equalizer has a transfer function that implements a set of band-pass filters, each band-pass filter having a constant band-pass, and each band-pass filter having a weight in the transfer function that is configurable, by:
providing a set of objective gains representing the objective equalization, each objective gain corresponding to a respective frequency;
determining values of the weights of the band-pass filters that minimize an error evaluated by comparing the set of objective gains to the transfer function, wherein the set of band-pass filters comprises at least one pair of band-pass filters having a common central frequency and distinct band-passes; and
setting the weights of the band-pass filters to the determined values.

13. The computer program product of claim 12 wherein the equalizer is configured to continuously apply the transfer function to an input numeric audio signal while the program instructions further configure the processor circuit to substantially simultaneously provide the set of objective gains representing the objective equalization, determine the values of the weights of the band-pass filters that minimize the error, and set the weights of the band-pass filters to the determined values.

14. The computer program product of claim 12 wherein the equalizer is configured to perform fixed-point implementation.

15. The computer program product of claim 12 wherein the program instructions further control the processor circuit to determine the values of the weights of the band-pass filters that minimize the error under the constraint of interpolating linearly the band-pass filters for each pair of band-pass filters having a common central frequency and distinct band-passes.

16. The computer program product of claim 12 wherein the band-pass filters are parallel.

17. The computer program product of claim 12 wherein the program instructions further configure the processor circuit to:
provide a set of final gains, each final gain corresponding to a respective frequency;
for each final gain corresponding to a respective frequency, determine a list of objective gains corresponding to the respective frequency, wherein the objective gains are successive, from a current gain corresponding to the respective frequency, to the final gain, wherein the difference between two successive objective gains is bounded; and
iterate providing the set of objective gains representing the objective equalization, determining the values of the weights of the band-pass filters that minimize the error, and setting the weights of the band-pass filters to the determined values over the successive objective gains.

18. The computer program product of claim 12 wherein to compare the set of objective gains to the transfer function, the program instructions further configure the processor circuit to define an objective function on the frequency domain and compute a value representative of the difference between the objective function and the transfer function, wherein the objective function is a piecewise polynomial function that is constrained by the set of objective gains and that minimizes a measure of oscillations.

19. The computer program product of claim 18 wherein the value representative of the difference between the objective function and the transfer function is a spectral difference between the objective function and the transfer function in the decibel domain.

20. The computer program product of claim 19 wherein to determine the values of the weights of the band-pass filters, the program instructions further configure the processor circuit to discretize the spectral difference and apply a Newton-Raphson method.

21. The computer program product of claim 20 wherein the program instructions further configure the processor circuit to provide a new set of objective gains while applying the Newton-Raphson method and continue applying the Newton-Raphson method on the basis of the new set of objective gains.

22. The computer program product of claim 12 wherein the transfer function further implements at least one shelving filter.

23. A non-transitory computer-readable medium having program instructions stored thereon that, when executed by a processor circuit, configures the processor circuit to configure an electronic device comprising an equalizer suited for processing a numeric audio signal according to an objective equalization, wherein the equalizer has a transfer function that implements a set of band-pass filters, each band-pass filter having a constant band-pass, and each band-pass filter having a weight in the transfer function that is configurable, by:
providing a set of objective gains representing the objective equalization, each objective gain corresponding to a respective frequency;
determining values of the weights of the band-pass filters that minimize an error evaluated by comparing the set of objective gains to the transfer function, wherein the set of band-pass filters comprises at least one pair of band-pass filters having a common central frequency and distinct band-passes; and
setting the weights of the band-pass filters to the determined values.

24. An electronic device comprising:
an equalizer suited for processing a numeric audio signal according to an objective equalization, wherein the equalizer comprises a transfer function that is based on a set of band-pass filters, each band-pass filter having a constant band-pass, and each band-pass filter having a weight in the transfer function that is configurable, and wherein the set of band-pass filters comprises at least one pair of band-pass filters having a common central frequency and distinct band-passes;
at least one memory circuit configured to store thereon program instructions; and
at least one processor circuit configured to execute the program instructions stored on the memory to:
provide a set of objective gains representing the objective equalization, each objective gain corresponding to a respective frequency;
determine values of the weights of the band-pass filters that minimize an error evaluated by comparing the set of objective gains to the transfer function, wherein the set of band-pass filters comprises at least one pair of band-pass filters having a common central frequency and distinct band-passes; and
set the weights of the band-pass filters to the determined values.

25. The electronic device of claim 24 wherein the equalizer is configured to continuously apply the transfer function to an input numeric audio signal while at least one processor circuit substantially simultaneously provides the set of objective gains representing the objective equalization, determines the values of the weights of the band-pass filters that minimize the error, and sets the weights of the band-pass filters to the determined values.

26. The electronic device of claim 24 wherein the equalizer is further configured to perform fixed-point implementation.

27. The electronic device of claim 24 wherein the at least one processor circuit is further configured to determine the values of the weights of the band-pass filters that minimize the error under the constraint of interpolating linearly the band-pass filters for each pair of band-pass filters having a common central frequency and distinct band-passes.

28. The electronic device of claim 24 wherein the band-pass filters are parallel.

29. The electronic device of claim 24 wherein the at least one processor circuit is further configured to:
provide a set of final gains, each final gain corresponding to a respective frequency;
for each final gain corresponding to a respective frequency, determine a list of objective gains corresponding to the respective frequency, wherein the objective gains are successive, from a current gain corresponding to the respective frequency, to the final gain, wherein the difference between two successive objective gains is bounded; and
iterate providing the set of objective gains representing the objective equalization, determining the values of the weights of the band-pass filters that minimize the error, and setting the weights of the band-pass filters to the determined values over the successive objective gains.

30. The electronic device of claim 24 wherein to compare the set of objective gains to the transfer function, the at least one processor circuit is further configured to define an objective function on the frequency domain and compute a value representative of the difference between the objective function and the transfer function, wherein the objective function is a piecewise polynomial function that is constrained by the set of objective gains and that minimizes a measure of oscillations.

31. The electronic device of claim 30 wherein the value representative of the difference between the objective function and the transfer function is a spectral difference between the objective function and the transfer function in the decibel domain.

32. The electronic device of claim 31 wherein to determine the values of the weights of the band-pass filters, the at least one processor circuit is further configured to discretize the spectral difference and apply a Newton-Raphson method.

33. The electronic device of claim 32 wherein the at least one processor circuit is further configured to provide a new set of objective gains while applying the Newton-Raphson method and continue to apply the Newton-Raphson method on the basis of the new set of objective gains.

34. The electronic device of claim 24 wherein the transfer function further implements at least one shelving filter.

35. The electronic device of claim 24 wherein the electronic device is a mobile communication device.

* * * * *